United States Patent [19]
Urban

[11] Patent Number: 5,952,870
[45] Date of Patent: Sep. 14, 1999

[54] CIRCUIT WITH HYSTERESIS AND METHOD USING SAME

[75] Inventor: Roman Urban, Trnava, Slovakia

[73] Assignee: Motorola, Inc., Schaumburg, Ill.

[21] Appl. No.: 08/999,082

[22] Filed: Dec. 29, 1997

[51] Int. Cl.[6] .................................................. H03K 3/037
[52] U.S. Cl. .......................................... 327/404; 327/206
[58] Field of Search .................................. 327/205, 206, 327/374, 375, 376, 377, 143, 198, 427, 434, 403, 404, 545, 546; 326/21, 36

[56] References Cited

U.S. PATENT DOCUMENTS

| | | | |
|---|---|---|---|
| 3,723,763 | 3/1973 | Udovic | 327/77 |
| 3,970,869 | 7/1976 | Coats, Jr. | 327/374 |
| 4,928,053 | 5/1990 | Sicard et al. | |
| 5,161,112 | 11/1992 | Guerra et al. | |
| 5,475,332 | 12/1995 | Ishimoto | 327/404 |
| 5,736,890 | 4/1998 | Yee et al. | 327/427 |

*Primary Examiner*—Toan Tran
*Attorney, Agent, or Firm*—Robert M. Handy; Rennie W. Dover

[57] ABSTRACT

An apparatus and method is provided with hysteresis for switching a load according to an input signal. There is a transfer gate for transferring a first signal to a second signal. A controller receives the first signal and the second signal and provides a control signal for the transfer gate. The control signal enables the transfer gate if the first signal reaches a first magnitude and disables the transfer gate if the first signal reaches a second magnitude. The control signal is obtained from a voltage divider across the first signal. A portion of the voltage divider is shorted out by a switch activated by a second signal. Thus, the control signal depends on the second signal. The apparatus is entirely powered by the second signal.

16 Claims, 1 Drawing Sheet

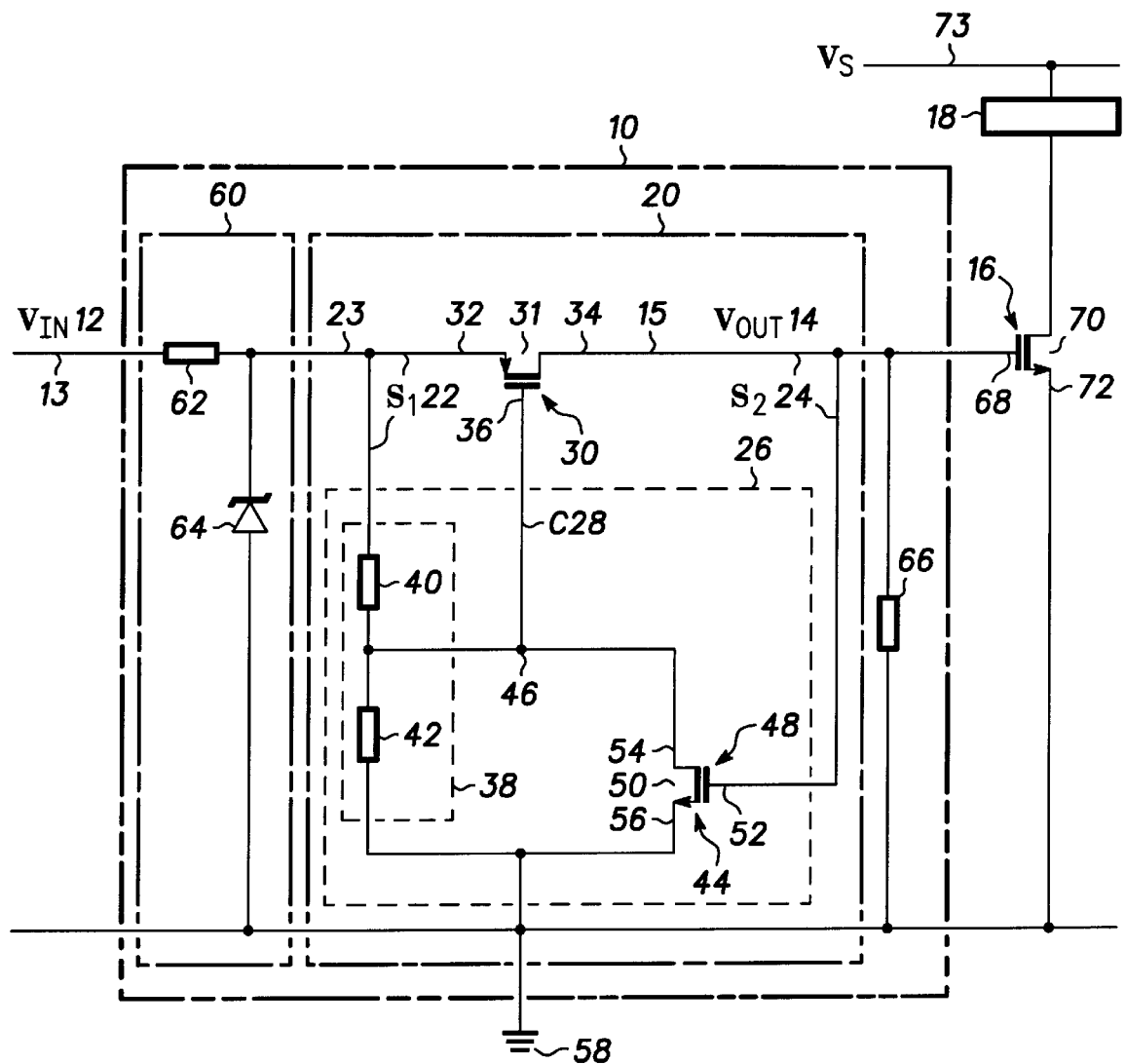

5,952,870

CIRCUIT WITH HYSTERESIS AND METHOD USING SAME

FIELD OF THE INVENTION

The present invention relates to circuits with hysteresis and methods for using such a circuit for switching with a noisy control signal.

BACKGROUND OF THE INVENTION

In the electronic arts it is often desired to perform switching on and off of an electric device with a switch controlled by a noisy control signal. The noise of the control signal can lead to unwanted repeated switching on and off if the control signal value is near the switching level of the switch. Methods to overcome this problem are well known in the art and usually use active electronic circuits such as Schmitt triggers with hysteresis, i.e. with different levels for switching on and switching off.

Such arrangements use more energy than is desired accordingly, it is a purpose of the present invention to avoid or reduce this and other deficiencies of the prior art.

BRIEF DESCRIPTION OF THE DRAWING

The sole FIGURE is a simplified schematic diagram of a circuit according to the present invention.

DETAILED DESCRIPTION OF THE PREFERRED EMBODIMENT

It is an advantage of the present invention to provide a circuit that switchingly transfers an analogous signal according to the value of this signal. It is another advantage of the present invention to provide a passive circuit for generating an output signal for switching a load from an input signal, which circuit does not need a power supply additional to the signal. It is a further advantage of the present invention to provide a circuit for switching a signal with a hysteresis. Its switching logic levels and thus the hysteresis can be set in a wide range and are substantially temperature independent.

The sole FIGURE shows circuit 10 receiving input signal $V_{IN}$ 12 on input line 13 and providing output signal $V_{OUT}$ 14 on output line 15 to load transistor 16 for switching load 18 on or off. Circuit 10 comprises transfer gate 20 for transferring first signal $S_1$ 22 on signal line 23 to second signal $S_2$ 24 on output line 15 and controller 26 receiving first signal $S_1$ 22 and second signal $S_2$ 24 and providing control signal C 28 for transfer gate 20. Control signal C 28 enables transfer gate 20 if first signal $S_1$ 22 reaches first magnitude $M_1$ and disables transfer gate 20 if first signal $S_1$ 22 reaches second magnitude $M_2$. Control signal C 28 depends on second signal $S_2$ 24.

In the following description reference will be made to gate-source voltages of p- and n-type field effect transistors (FETs) with respect to their threshold voltages. In order to omit sign confusion, all voltages will mean absolute values. The actual signs follow obviously from the circuit elements and the type of the respective FET.

Transfer gate 20 comprises first transistor 30, e.g. p-type FET 31, which receives first signal $S_1$ 22 at its first main electrode, e.g. source 32, and provides second signal $S_2$ 24 at its second main electrode, e.g. drain 34, and receives control signal C 28 at its control electrode, e.g. gate 36. P-type FET 31 is conductive if voltage $V_{GS31}$ between source 32 and gate 36 is greater than its internal threshold voltage $V_{th31}$ and is non-conductive if not.

Controller 26 comprises voltage divider 38 having serially coupled first resistance 40 and second resistance 42 and switch 44 for shorting second resistance 42. Controller 26 provides control signal C 28 at node 46 between first and second resistances 40, 42. Switch 44 comprises second transistor 48, e.g. n-type FET 50, controlled by second signal $S_2$ 24 at its gate 52 which is coupled to drain 34 of transistor 30. Drain 54 of transistor 48 is coupled to node 46 and source 56 of transistor 48 is coupled to a reference signal, e.g. ground 58. N-type FET 50 is conductive if voltage $V_{GS50}$ between source 56 and gate 52 is greater than its internal threshold voltage $V_{th50}$ and is non-conductive if not.

Circuit 10 desirably further comprises protection circuit 60 with protection resistance 62 between input line 13 and signal line 23 and Zener diode 64 between signal line 23 and ground 58 for limiting the maximum voltage at signal line 23 to the Zener voltage.

Circuit 10 also preferably comprises discharge resistance 66 between output line 15 and ground 58 for discharging output line 15 and gate 68 of load transistor 16, e.g. an n-type FET. N-type FET 70 is conductive if voltage $V_{GS70}$ between source 72 and gate 68 is greater than its internal threshold voltage $V_{th70}$ and is non-conductive if not. Therefore, load transistor 16 switches load 18 on or off if voltage $V_{GS70}$ is greater or smaller, respectively, than its internal threshold voltage $V_{th70}$. Load 18 is powered from supply $V_S$ via supply line 73.

In order to describe the function of circuit 10 it is assumed that circuit 10 is initially completely at ground potential. Now input signal $V_{IN}$ 12 on input line 13 begins to rise but with noise and thus not monotonically. First signal $S_1$ 22 is somewhat lower than input signal $V_{IN}$ 12 because of a voltage loss in protection resistance 62 due to a current through voltage divider 38. As long as voltage $V_{GS31}$ is smaller than threshold voltage $V_{th31}$, FET 31 is non-conductive and thus transfer gate 20 is closed. Line 15 is still at ground level so that load transistor 16 switches load 18 off and FET 50 is non-conductive because voltage $V_{GS50}$ is smaller than threshold voltage $V_{th50}$.

In this condition of FET 50 being non-conductive, control signal C 28 at node 46 is derived from first signal $S_1$ 22 by voltage divider 38 which divides first signal $S_1$ 22 according to the values of first resistance 40 and second resistance 42. In this condition control signal C 28 rises relative to ground level according to the increasing voltage drop at second resistance 42. Voltage $V_{GS31}$ increases with the voltage drop at first resistance 40 and is still smaller than threshold voltage $V_{th31}$.

When the increasing voltage drop at first resistance 40 reaches threshold voltage $V_{th31}$, then FET 31 becomes conductive and thus transfer gate 20 opens. Now, first signal $S_1$ 22 is passed to output line 15 and second signal $S_2$ 24 becomes substantially equal to first signal $S_1$ 22. In FET 70, voltage $V_{GS70}$ becomes greater than threshold voltage $V_{th70}$ and load transistor 16 switches load 18 on. In FET 50 voltage $V_{GS50}$ becomes greater than threshold voltage $V_{th50}$ and FET 50 becomes conductive and shorts or provides a lesser resistance path across second resistance 42 of voltage divider 38. Therefore, control signal C 28 is drawn to ground level and the complete voltage of first signal $S_1$ 22 drops at first resistance 40, which increases voltage $V_{GS31}$ so that it becomes distinctly higher than threshold voltage $V_{th31}$. Thus, another stable condition of circuit 10 is reached, in which n-type FET 50 is conductive and control signal C 28 is drawn to ground level. This condition is stable in that it is independent of noise of first signal $S_1$ 22. In this preferred embodiment FET 50 substantially shorts second resistance 42.

This condition lasts until first signal $S_1$ 22, which at this time appears substantially completely across first resistance 40 and equals voltage $V_{GS31}$, decreases to about threshold voltage $V_{th31}$. Transistor 30 turns off. Then, discharge resistance 66 discharges output line 15 and gate 68 of load transistor 16 and load transistor 16 switches load 18 off.

Those of skill in the art will further know that protection circuit 60 is not necessary for carrying out the invention. If protection circuit 60 is omitted, input signal $V_{IN}$ 12 can be identical to first signal $S_1$ 22. Protection circuit 60 shows only that such simple over-voltage protection is possible for circuit 10. Typically the voltage drop at protection resistance 62 is negligible but it can be taken into account for dimensioning the values of resistances 40 and 42 of voltage divider 38.

Circuit 10 has the advantage that it switchingly transfers an analog signal according to the value of this signal and omits unstable switching conditions. Further, circuit 10 provides a passive circuit for generating an output signal for switching a load from an input signal, which circuit does not need a power supply additional to the signal. The apparatus and method according to the invention can advantageously be used in automotive and portable electronics where it is important to save power of the control electronics when a load is switched off.

Circuit 10 also can be seen as having hysteresis for providing a switching signal, e.g. output signal $V_{OUT}$ 14. The hysteresis effect can be seen in that control signal C 28 enables transfer gate 20 if first signal $S_1$ 22 reaches a first magnitude $M_1$ and disables transfer gate 20 if first signal $S_1$ 22 reaches a second magnitude $M_2$. Control signal C 28 depends on second signal $S_2$ 24. The switching logic levels of circuit 10 and thus the hysteresis are substantially temperature independent and can be set in a wide range by choosing the threshold voltage $V_{th31}$ and the ratio of the values of first resistance 40 and second resistance 42 of voltage divider 38. Advantageously the threshold voltages $V_{th31}$ of p-type FET 31 and $V_{th50}$ of n-type FET 50 are similar and preferably they are substantially equal.

An apparatus comprises transfer gate 20 for transferring first signal $S_1$ 22 to a second signal $S_2$ 24. Controller 26 receives first signal $S_1$ 22 and second signal $S_2$ 24 and provides control signal C 28 for the transfer gate 20, wherein controller 26 derives control signal C 28 from first signal $S_1$ 22 either in a first magnitude relation or in a second magnitude relation, the magnitude relations depend on second signal $S_2$ 24.

There is desired a method for providing a control signal C 28 from an input signal by a transfer gate, which comprises the following steps:
1. receiving the input signal by a controllable divider and deriving a transfer signal for the transfer gate;
2. forwarding the input signal as the control signal by the transfer gate receiving the transfer signal when the input signal reaches a first magnitude;
3. modifying the transfer signal from the divider without changing the control signal;
4. stopping forwarding the input signal as the control signal by the transfer gate receiving the modified transfer signal when the input signal reaches a second magnitude.

There is further desired a method for selectively forwarding an input signal to an output signal through first and second main electrodes of a transistor, which comprises the following steps:
1. deriving a control signal as a first fraction of the input signal;
2. making the transistor conductive when the control signal passes an inherent reference magnitude at a control electrode of the transistor in a first direction;
3. changing the control signal from the first fraction to a second fraction of the input signal while the transistor stays conductive; and
4. making the transistor non-conductive by modifying the input signal so that the second fraction of the input signal passes the inherent reference magnitude in a second opposite direction.

The foregoing description of the preferred embodiment employs a circuit which receives a positive input voltage with respect to ground. Those skilled in the art will know that a circuit according to the invention can also be adapted to a negative input voltage with respect to ground, for example by using FETs of inverse type. Also it is possible to use current control and bipolar transistors instead of voltage control and FETs without leaving the scope of the invention.

In the foregoing detailed description of the preferred embodiment, reference is made to the accompanying drawings which form a part hereof, and in which are shown by way of illustration specific embodiments in which the invention can be practiced. These embodiments have been described in sufficient detail to enable those skilled in the art to practice the invention, and it is to be understood that other embodiments can be utilized and that logical, mechanical and electrical changes can be made without departing from the spirit and scope of the present invention. The foregoing detailed description is, therefore, not to be taken in a limiting sense, and the scope of the present inventions is defined only by the appended claims.

I claim:

1. An apparatus comprising a transfer gate for transferring a first signal to a second signal and a controller receiving the first signal and the second signal and providing a control signal for the transfer gate, wherein the control signal enables the transfer gate if the first signal reaches a first magnitude and disables the transfer gate if the first signal reaches a second magnitude, and wherein the control signal is generated from a portion of the first signal and depends on the second signal.

2. An apparatus comprising a transfer gate for transferring a first signal to a second signal and a controller receiving the first signal and the second signal and providing a control signal for the transfer gate, wherein the controller has a variable voltage divider controlled by the second signal to derive the control signal from the first signal either in a first magnitude relation or in a second magnitude relation, and wherein the magnitude relations depend on the second signal.

3. The apparatus of claim 2 wherein the transfer gate is a first transistor which receives the first signal at a first main electrode and provides the second signal at a second main electrode and receives the control signal at a control electrode.

4. The apparatus of claim 3 wherein the first transistor is a field effect transistor with a source as the first electrode, a drain as the second main electrode and a gate as the control electrode.

5. The apparatus of claim 2 wherein the controller is a voltage divider having serially coupled a first resistance and a second resistance and a switch for substantially reducing the second resistance, the controller providing the control signal in the first magnitude relation at a node between the first and second resistances when the switch is open and providing the control signal in the second magnitude relation at the node when the switch is closed.

6. The apparatus of claim 5 wherein the switch is controlled by the second signal.

7. The apparatus of claim 5 wherein the switch is a second transistor being controlled by the second signal.

8. A circuit with hysteresis for providing a switching signal comprises a first FET of a first conductivity type, a voltage divider coupled to the source of the first FET at the input of the circuit and a reference potential, the gate of the first FET being coupled to the voltage divider and to the drain of a second FET of a second conductivity type, wherein the drain of the first FET at the output of the circuit is coupled to the gate of the second FET, and the source of the second FET is coupled to the reference potential.

9. The circuit of claim 8, comprising a discharge resistance between the output of the circuit and the reference potential for discharging the output.

10. The circuit of claim 8, comprising a protection resistance within the input of the circuit and a Zener diode coupled to the source of the first FET and to the reference potential.

11. The circuit of claim 8, wherein the output of the circuit is coupled to the gate of a switching transistor for switching a load.

12. A method for providing a control signal from an input signal by a transfer gate, the method comprising the steps of:

receiving the input signal by a controllable divider and deriving a transfer signal for the transfer gate;

forwarding the input signal as the control signal by the transfer gate receiving the transfer signal when the input signal reaches a first magnitude;

in response to the control signal, modifying the transfer signal from the divider without changing the control signal;

stopping forwarding the input signal as the control signal by the transfer gate receiving the modified transfer signal when the input signal reaches a second magnitude.

13. A method for selectively forwarding an input signal to an output signal through first and second main electrodes of a transistor, the method comprising the steps of:

deriving a control signal as a first fraction of the input signal;

making the transistor conductive when the control signal passes an inherent reference magnitude at a control electrode of the transistor in a first direction;

changing the control signal from the first fraction to a second fraction of the input signal while the transistor stays conductive, wherein the control signal is changed due to feedback from the output signal; and making the transistor non-conductive by modifying the input signal so that the second fraction of the input signal passes the inherent reference magnitude in a second opposite direction.

14. The method of claim 13, wherein the input signal is a voltage signal and the control signal is a voltage signal derived by a voltage divider.

15. The method of claim 14, wherein in the changing step a switch controlled from said second main electrode reduces a resistance of the voltage divider.

16. The method of claim 13, wherein the inherent reference magnitude is a threshold voltage of the transistor.

* * * * *